United States Patent [19]
Nakahira

[11] Patent Number: 6,011,302
[45] Date of Patent: Jan. 4, 2000

[54] SEMICONDUCTOR DEVICE WITH REDUCED AMOUNT OF SEALING RESIN

[75] Inventor: Akira Nakahira, Nagano, Japan

[73] Assignee: Fuji Electric Co., Ltd., Kawasaki, Japan

[21] Appl. No.: 09/082,480

[22] Filed: May 21, 1998

[51] Int. Cl.$^7$ .................................................. H01L 23/48
[52] U.S. Cl. ........................ 257/690; 257/692; 257/790
[58] Field of Search ................................... 257/690, 694, 257/790, 584, 692

[56] References Cited

U.S. PATENT DOCUMENTS 5,243,223  9/1993  Yamada et al. ........................ 257/790
5,471,089  11/1995  Nagatomo et al. ..................... 257/693

FOREIGN PATENT DOCUMENTS 4-233269  8/1992  Japan .

Primary Examiner—Carl Whitehead, Jr.
Assistant Examiner—Roy Potter
Attorney, Agent, or Firm—Kanesaka & Takeuchi

[57] ABSTRACT

A semiconductor device includes a resin case for covering a semiconductor element, and main terminal frames for externally guiding electrodes of the semiconductor element. The main terminal frames with different polarities are installed inside the resin case such that relative positions thereof are offset in a vertical direction to form upper and lower sides. Main terminal pieces are connected to the respective terminal frames to protrude vertically from a top surface of the resin case. The main terminal pieces have rising bases connected to the terminal fames, wherein the rising base and the terminal frame connected thereto which are located at the upper side are sealed with a material same as the resin case. A gel sealing resin is charged into the resin case to seal at least one terminal frame installed at the lower side. Thus, the amount of the gel sealing resin for filling the resin case is reduced to prevent the overflow of the resin while maintaining the required insulation between the terminals with the different polarities.

8 Claims, 5 Drawing Sheets

SEMICONDUCTOR DEVICE WITH REDUCED AMOUNT OF SEALING RESIN

BACKGROUND OF THE INVENTION AND RELATED ART STATEMENT

The present invention relates to a semiconductor device that is implemented in an IGBT (Insulated Gate Bipolar Transistor) module, or to its assembled structure.

The assembled structure of a conventional semiconductor device is shown in FIG. 2 in conjunction with the IGBT module described above. In the figure, 1 is an IGBT chip element; 2 is a ceramic substrate on which the chip element is mounted; 3 is a radiating metal base on which the ceramic substrate 2 is installed; 4 is an enclosure or resin case as a terminal case; 4a is a top cover for the resin case 4; 5 is an emitter terminal frame for an externally drawn terminal; 6 is a collector terminal frame; 7 is a gate terminal frame; 8 is a bonding wire that connects the IGBT terminal 1 and a conductor pattern 2a on the ceramic substrate 2; and 9 is a silicone gel (gel type sealing resin) that fills the resin case 4. In the figure, reference symbol E designates an emitter terminal, C denotes a collector terminal, and G indicates a gate terminal.

The terminal frames 5, 6 and 7 are drawn upwardly from the ceramic substrate 2 and installed inside the resin case 4, and their leg pieces 5a, 6a and 7a are soldered to a conductor pattern 2a corresponding to the emitter, collector and gate formed on the ceramic substrate 2. The emitter and collector main terminal pieces 5b and 6b are welded to the emitter and collector terminal frames 5 and 6 respectively, protrude vertically as main circuit terminals through the case cover 4a, and are drawn from the top surface of the resin case 4. After the resin case 4 has been bonded to the metal base 3, the resin case is filled with liquid silicone and the top cover 4a is then installed. Subsequently, a heating process is executed to gel the silicone to resin-seal the chip element 1 and the terminal frames 5, 6 and 7 in order to provide the required insulation.

Only one chip element 1 is shown in the figure, but in the actual IGBT module, multiple ceramic substrates 2 on which multiple IGBT chip elements 1 are mounted are juxtaposed on the metal base 3 with the chip elements 1 being connected in parallel via the terminal frames 5, 6 and 7 extending across the ceramic substrates 2, thereby constituting the IGBT module with a large capacity.

In the semiconductor device with the above structure, the emitter and collector terminal frames 5 and 6, which are the externally drawn terminals of the main circuit, are installed in proximity in a limited space inside the resin case 4, and the main terminal pieces 5b and 6b protruding vertically from the terminal frames are drawn from the top surface of the case in such a way as to extend parallel to each other. Therefore, to fill the resin case 4 with the silicone gel to provide the required dielectric voltage resistance between the terminals of different polarities, the amount of silicone gel 9 with which the case 4 is filled must be set so that the terminal frames 5 and 6 are both immersed in the silicone gel 9.

In this case, in a module with the height of the resin case 4 almost the same as the wiring height of the terminal frames installed inside the resin case 4 in order to minimize the thickness of a package for the module, the filling level H2 of the silicone gel 9 in the resin case 4 is almost the same as the height of the top surface of the resin case 4.

Therefore, when the resin case is filled with liquid silicone during an assembly process for the semiconductor device or a resin-filled module assembly is transferred to the subsequent gelling process via a conveyor, slight vibration or impact often causes the liquid silicone to overflow from the enclosure resin case 4, and the silicone sticks to the outer surface of the package and degrades the appearance of the product. This is one of the causes of a decrease in product yield.

This invention is provided in view of the above point. The object is to provide a semiconductor device with improved structure so as to reduce the amount of a gel sealing resin in a resin case to prevent the sealing resin from overflowing during the assembly process while mutually insulating terminal frames of different polarities.

SUMMARY OF THE INVENTION

To achieve this object, the invention provides a semiconductor device comprising a semiconductor element mounted on a conductor pattern on an insulating substrate; a radiating metal base on which the insulating substrate is installed; an enclosure or resin case with a top cover that also acts as a terminal case combined with the metal base; and terminal frames for externally guiding terminals of the semiconductor element, each being installed inside the resin case and having a leg portion soldered to the conductor pattern on the insulating substrate. Main terminal pieces protrude vertically from the respective terminal frames and are drawn from the top surface in such a way as to extend side by side, and the resin case is filled with a gel sealing resin.

In the invention, main circuit terminal frames of different polarities are installed inside the resin case in such a way that their relative positions are offset in the vertical direction. The terminal frame installed on the upper side is sealed with the same material as the resin case on its periphery including at least a rising base of the main terminal piece, while the terminal frame installed on the lower side is sealed with the gel sealing resin that fills the resin case. The gel resin in the resin case is set such that the terminal frame on the lower side is immersed in the gel resin, while the terminal frame on the upper side is exposed above the gel resin.

According to this structure, the insulation required between vertically disposed terminal frames with the different polarities and between the bases of the main terminal pieces drawn from the terminal frames is maintained by the molding resin that seals the upper terminal frame and forms the resin case, and by the gel sealing resin that seals the lower terminal frame and fills the enclosure resin case.

Furthermore, the resin case need not be completely filled with the gel sealing resin, but the level of the filled resin may be set low as long as the lower terminal frames are immersed in the resin. This structure reliably avoids overflow during the assembly process of the liquid sealing resin in the resin case.

In addition, if the semiconductor element is an insulated gate bipolar transistor (IGBT) module having an emitter terminal frame, a collector terminal frame, and a gate terminal frame that are insert-molded in the resin case, the emitter and collector terminal frames are installed inside the resin case in such a way that their relative positions are offset in the vertical direction; an emitter main terminal piece and a collector main terminal piece protruding vertically from the respective terminal frames penetrate the case cover and are drawn from the top surface of the enclosure resin case; and the terminal frame on the upper side is sealed with the same material as the enclosure resin case on its periphery including at least the rising base of the main terminal piece, while the terminal frame on the lower side is sealed with the silicone gel that fills the resin case.

DETAILED DESCRIPTION OF PREFERRED EMBODIMENTS

Figure 1:
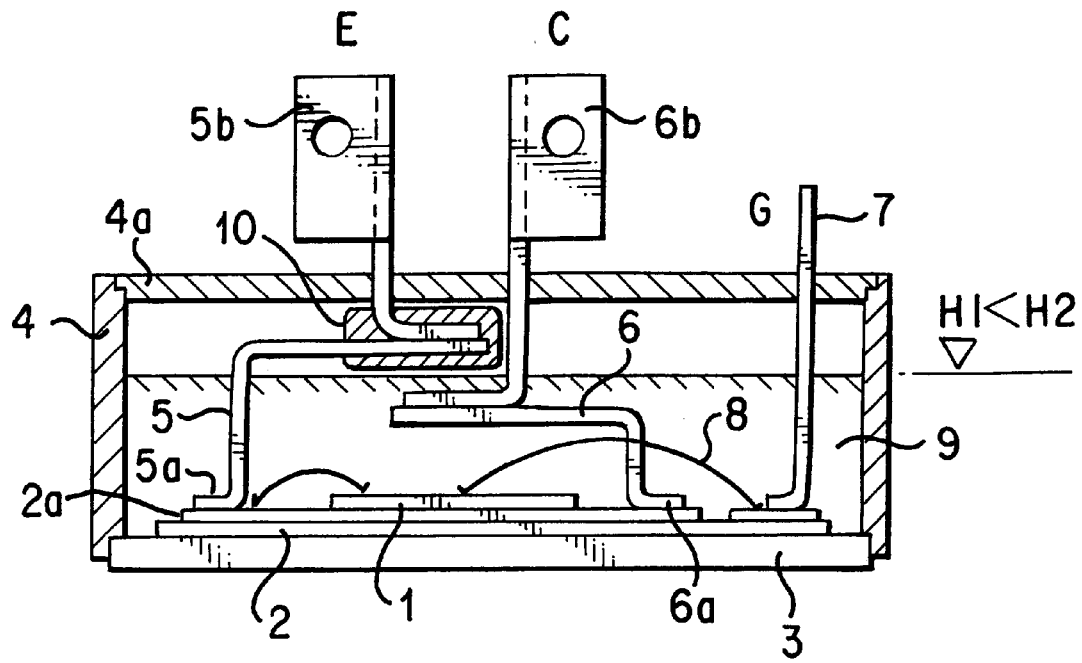
FIG. 1 is a sectional view schematically showing an assembled structure of a semiconductor device according to a basic embodiment of this invention.

Next, an embodiment of this invention is described with reference to the drawings. In the illustration of the embodiment, the same reference numerals indicate the same members as in FIG. 2.

FIG. 1 shows the configuration of a basic embodiment of this invention in conjunction with an IGBT module. This configuration differs from the conventional configuration in FIG. 2 in that the emitter and collector terminal frames 5 and 6 are installed inside the resin case 4 in such a way that their relative positions are offset in the vertical direction; the periphery of the emitter terminal frame 5 including the rising base of the main terminal piece 5b is sealed with a molding resin 10 same as that forming the resin case 4; and the filling level H1 of the silicone gel 9 in the resin case 4 is set so that the collector terminal frame 6 on the lower side is immersed in the silicone gel 9, while the emitter terminal frame 5 on the upper side is exposed above the silicone gel 9.

Figure 2:
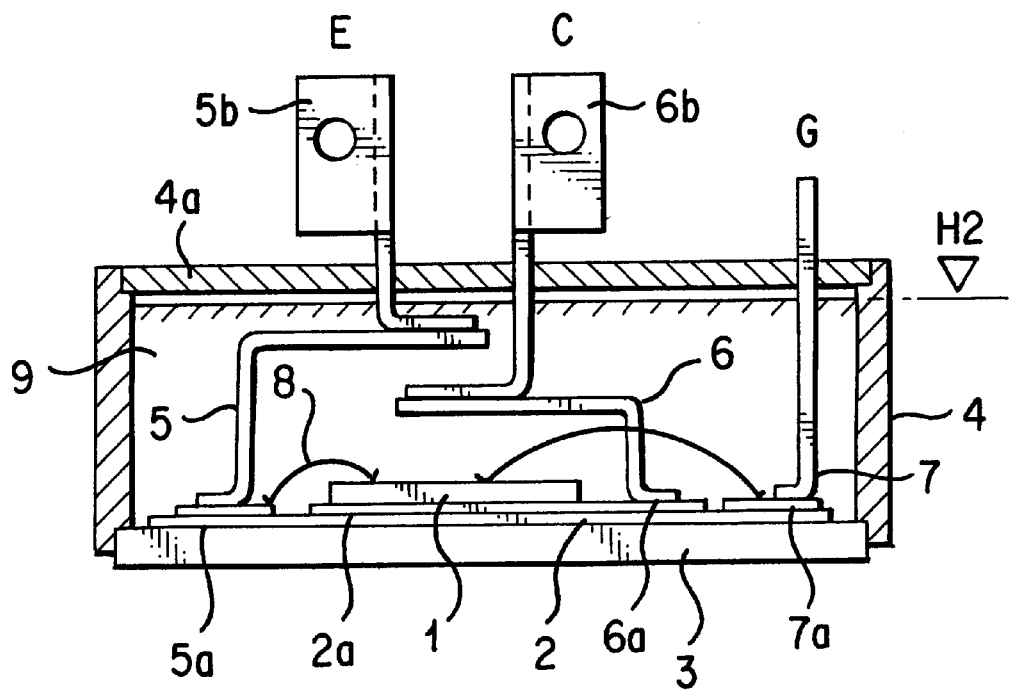
FIG. 2 is a sectional view showing the assembled structure of a conventional semiconductor device similar to FIG. 1.

This configuration sets the filling level H1 of the silicone gel 9 lower than the filling level H2 shown in FIG. 2, and the level H1 is also lower than the full level of the resin case 4. This configuration thus avoids the overflow of liquid silicone from the resin case during the assembly process, which might cause the trouble of sticking of silicone to the outer surface of the case. Furthermore, since the periphery of the base of the emitter main terminal piece 5b protruding vertically from the emitter terminal frame 5 exposed above the silicone gel 9 is sealed with the molding resin 10, the required dielectric voltage resistance is maintained between the terminal frames with different polarities, that is, between the emitter terminal frame 5 and the collector terminal frame 6 immersed in the silicone gel 9 and between the emitter terminal frame 5 and the collector main terminal piece 6b located close to the emitter terminal frame 5 and drawn upward from the collector terminal frame 6.

As an example, the specific assembled structure of an IGBT module in which 12 IGBT chip elements are connected in parallel is shown in FIGS. 3 to 6(c). In these figures, reference numerals correspond to those of the members shown in FIG. 1.

Figure 3:
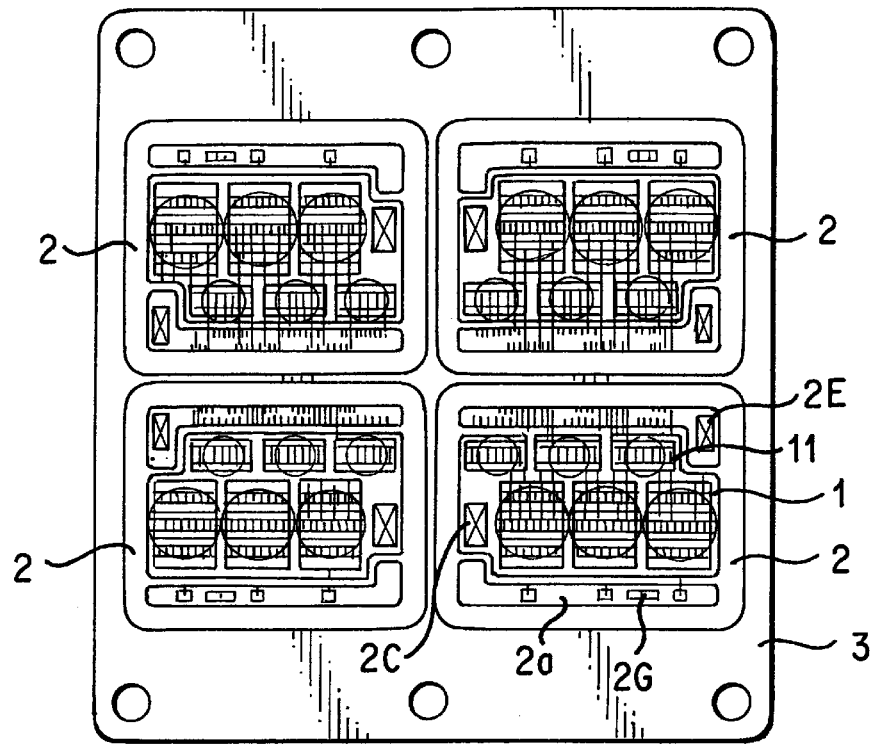
FIG. 3 is a plan view of the assembled state of an IGBT module in which multiple ceramic substrates are installed on a metal base.

In FIG. 3, four ceramic substrates 3 are juxtaposed on the metal base 3, and three IGBT chips 1 and diode chip elements 11 connected parallel to the respective IGBT chip elements 1 are mounted on a conductor pattern 2a on each ceramic substrate 2. As is well known, the conductor pattern 2a is divided into patterns corresponding to an emitter E, a collector C and a gate G, and soldering lands 2E, 2C and 2G are formed on the respective patterns so that the emitter, collector and gate terminal frames can be connected to the respective lands.

Figure 4:
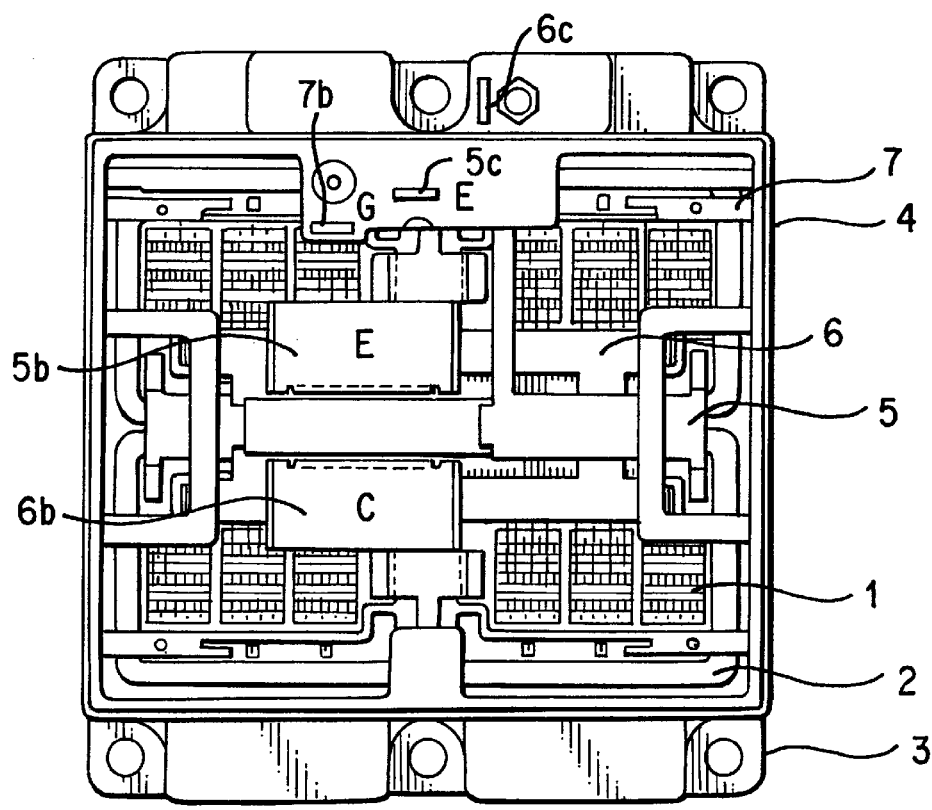
FIG. 4 is a plan view of an assembled state in which a resin case on which terminal frames are installed is fixed to the assembly in FIG. 3.

FIG. 4 is a plan view showing an assembled state in which the resin case 4, which also acts as a terminal case into which the emitter, collector, and gate terminal frames 5, 6 and 7 are integrated, is secured to the circuit assembly shown in FIG. 3.

Figure 5:
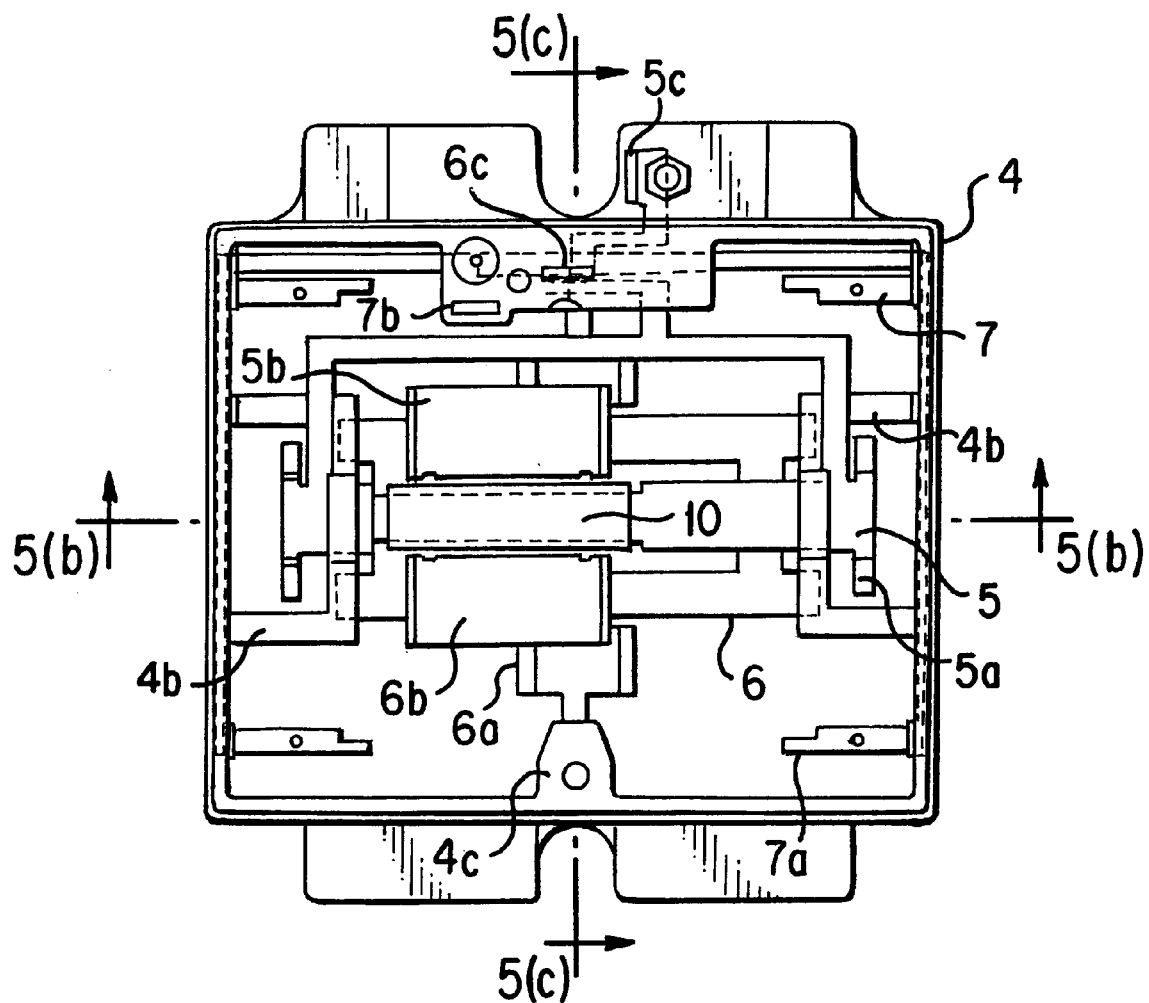
FIG. 5(a) is a plan view showing a detailed structure of the resin case in FIG. 4.
FIG. 5(b) is a sectional view taken along line 5(b)—5(b) in FIG. 5(a)
FIG. 5(c) is a sectional view taken along line 5(c)—5(c) in FIG. 5(a)
Figure 5B:
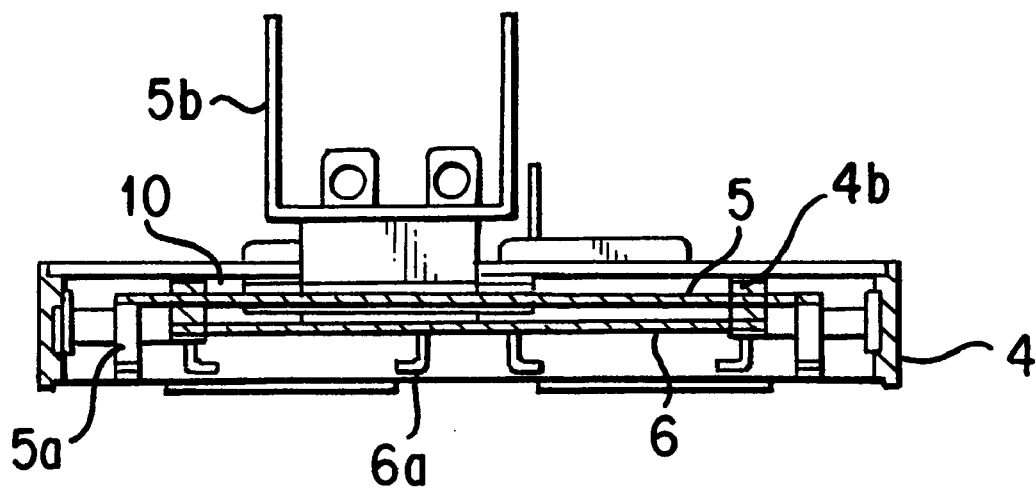
Figure 5C:
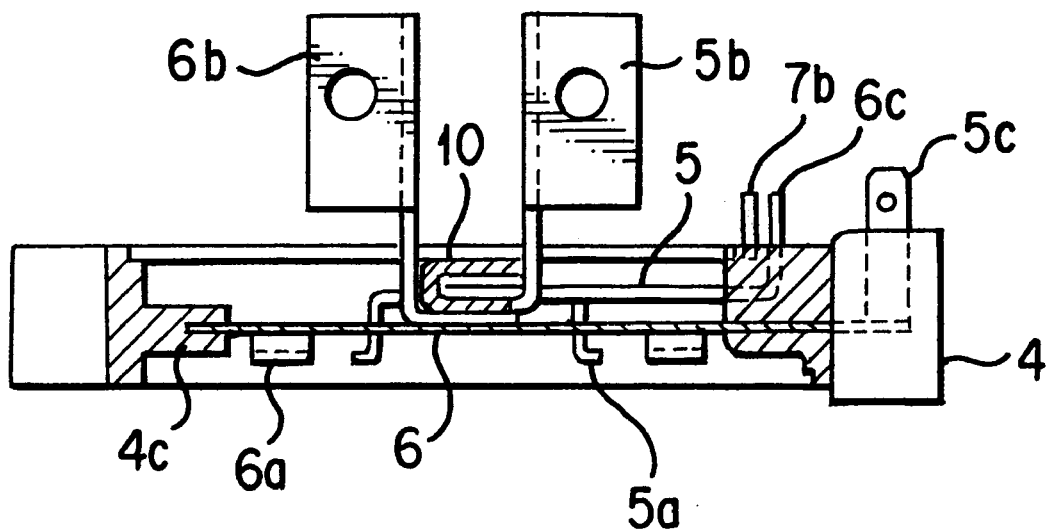
Figure 6A:
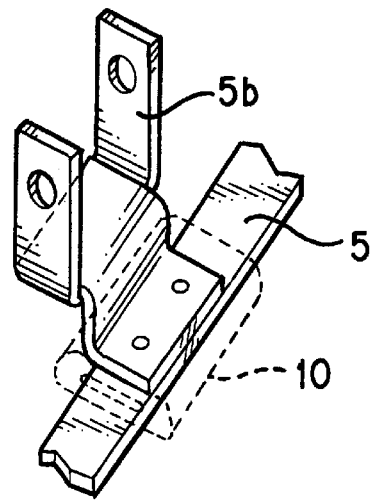
FIG. 6(a) is s perspective view of the periphery of an emitter main terminal piece drawn from an emitter terminal frame shown in FIGS. 5(a)–5(c)
Figure 6B:
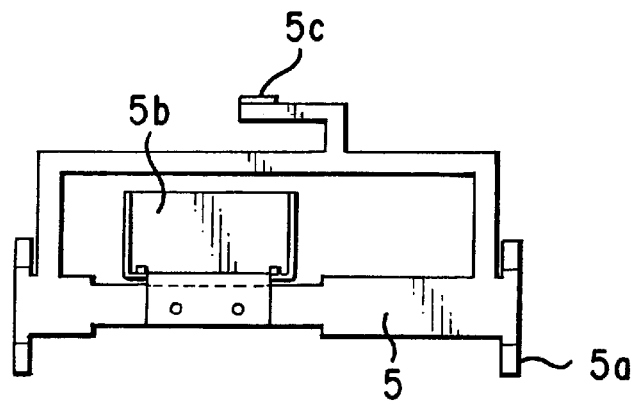
FIGS. 6(b) and 6(c) are plan views of the emitter terminal frame and a collector terminal frame, respectively.
Figure 6C:
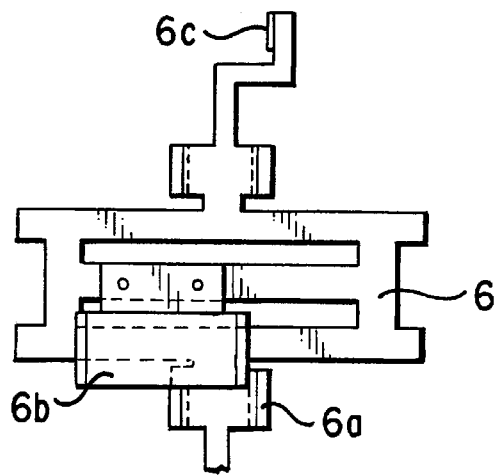

Next, the detailed structure of the resin case 4 into which the terminal frames 5, 6 and 7 are integrated is shown in FIGS. 5(a) to 5(c) and FIGS. 6(a) to 6(c). The emitter and collector terminal frames 5 and 6 are formed by punching a copper plate, bending the metal pieces as shown in FIGS. 6(b) and (c), and welding the metal pieces with the separate emitter and collector main terminal pieces 5b and 6b. In addition, auxiliary terminal pieces 5c and 6c are formed at the end of the emitter and collector terminal frames 5 and 6 by drawing out. Although not shown, the gate terminal frame 7 is formed by punching a copper plate, and a leg piece 7a that is soldered to the ceramic substrate 2 and a terminal piece 7b that is externally drawn out are formed on the frame by folding.

To integrate each terminal frame into the resin case 4, the terminal frames 5, 6 and 7 are located at the respective predetermined positions and set in a mold for the resin case 4, and the mold is filled with a molding resin for the integrated insert molding. During the molding process, the periphery of the emitter terminal frame 5 including the rising base of the emitter main terminal piece 5b is sealed with the molding resin 10 as shown in FIG. 6(a). As shown in FIGS. 5(a)–5(c), the ends of the emitter and collector terminal frames 5 and 6 are supported by a U-shaped arm portion 4b and a swollen portion 4c, and the gate terminal frame 7 is embedded in the inner circumference wall of the resin case 4.

Next, the resin case 4 is placed on and bonded to the circumferential edge of the metal base 3 as shown in FIG. 4, the leg pieces 5a, 6a and 7a extending downward from the terminal frames 5, 6 and 7, respectively, are soldered to the conductor pattern 2a on the ceramic substrate 2, and the resin case 4 is filled with silicone gel. In this case, the amount of silicone gel 9 in the resin case is set to provide a filling level H1 such that the collector terminal frame 6 is embedded in the silicone gel layer, while a part of the emitter terminal frame 5 is exposed above the silicone gel 9, as illustrated in FIG. 1. After being filled with the silicone gel, the resin case 4 is covered with the top cover 4a, and the emitter and collector main terminal pieces 5a and 6a are bent to complete the product.

As described above, according to this invention, the semiconductor device comprises a semiconductor element mounted on a conductor pattern on an insulating substrate; a radiating metal base on which the insulating substrate is installed; a resin case with a top cover that also acts as a terminal case combined with the metal base; and terminal frames for externally guiding terminals corresponding to respective electrodes of the semiconductor element, each terminal frame being installed inside the resin case and having a leg portion soldered to the conductor pattern on the insulating substrate. Main terminal pieces protruding vertically from the respective terminal frames are drawn and placed on the top surface of the resin case so as to extend side by side, and the resin case is filled with a gel sealing resin. Main circuit terminal frames with different polarities are installed inside the resin case in such a way that their relative positions are offset in the vertical direction, and the terminal frame on the upper side is sealed with the same material as the resin case on its periphery including at least the rising base of the main terminal piece, while the terminal frame on the lower side is sealed with the gel sealing resin that fills the resin case. In addition, the level of the gel resin in the resin case is set such that the lower side of the terminal frame is immersed in the gel resin, while the upper side of the terminal frame is exposed above the gel resin.

(1) Thus, the dielectric voltage resistance required between the vertically disposed terminal frames with different polarities and between the bases of the main terminal pieces drawn from the terminal frames is maintained by the molding resin that seals the upper terminal frame and forms the resin case, and by the gel sealing resin that seals the lower terminal frame and fills the resin case.

(2) Furthermore, the gel sealing resin need not fill the resin case completely, but the level of the filled resin may be set low as long as the lower terminal frame is immersed in the resin. This configuration reliably avoids overflow during the assembly process of the liquid sealing resin in the enclosure resin case.

This invention can maintain sufficient insulation between the terminals with the different polarities. During the process of filling the resin case with the gel sealing resin, this invention can avoid the overflow of the sealing resin from the resin case, which results in the sticking of the resin to the outer surface of the case and the degradation of the appearance of the device. As a result, this invention can improve the product yield.

What is claimed is:

1. A semiconductor device comprising:

an insulation substrate with a conductor pattern, a semiconductor element mounted on the conductor pattern and having electrodes, a resin case for enclosing the semiconductor element having a top cover, main terminal frames with different polarities for externally guiding the electrodes of the semiconductor element, each main terminal frame having a leg portion fixed to the conductor pattern on the insulating substrate, a first vertical portion vertically extending from the leg portion, a lateral portion bent relative to the first vertical portion to be substantially parallel to the insulation substrate, and a second vertical portion bent relative to the lateral portion and extending vertically therefrom, said second vertical portion forming a main terminal piece to protrude vertically from a top surface of the resin case, relative positions of the lateral portions of said main terminal frames being offset in a vertical direction to form upper and lower sides, and a gel sealing resin filled in the resin case, said gel sealing resin sealing the lateral portion at the lower side and the first vertical portions below the lower side while the lateral portion at the upper side is exposed above the gel resin in the resin case.

2. A semiconductor device according to claim 1, wherein the semiconductor element is an insulated gate bipolar transistor having an emitter terminal frame, a collector terminal frame and a gate terminal frame, which form said main terminal frames and are insert-molded in the resin case, the emitter and collector terminal frames being installed inside the resin case such that relative positions are offset in the vertical direction.

3. A semiconductor device according to claim 2, wherein said main terminal pieces include an emitter main terminal piece and a collector main terminal piece extending vertically from the respective terminal frames and penetrating the top cover to be drawn from the top surface of the resin case, and said gel sealing resin is a silicon gel filling the lower side of the terminal frame and the resin case.

4. A semiconductor device according to claim 1, wherein one of said lateral portions vertically offset from the other is formed on the upper side and covered with the material same as the resin case.

5. A semiconductor device according to claim 4, wherein said insulating substrate is installed on a radiating metal base.

6. A semiconductor device comprising:

an insulation substrate with a conductor pattern, a semiconductor element mounted on the conductor pattern and having electrodes, a resin case for enclosing the semiconductor element having a top cover, main terminal frames with different polarities for externally guiding the electrodes of the semiconductor element, each having a leg portion fixed to the conductor pattern on the insulating substrate, a vertical portion extending from the leg portion, and a lateral portion extending laterally from the vertical portion, said main terminal frames with different polarities being installed inside the resin case such that relative positions of the lateral portions are offset in a vertical direction to form upper and lower sides, main terminal pieces connected to the respective terminal frames and arranged side by side to protrude vertically from a top surface of the resin case, each main terminal piece having a rising base connected to the lateral portion of the terminal frame, one of said rising bases and one of the lateral portions of the terminal frames connected together and located at the upper side being substantially entirely covered with a material same as the resin case, and a gel sealing resin filled in the resin case, one of the rising bases and one of the lateral portions located at the lower side being immersed in the gel sealing resin while the rising base and the lateral portion covered with the material and located at the upper side are situated above the gel sealing resin.

7. A semiconductor device according to claim 6, wherein the semiconductor element is an insulated gate bipolar transistor having an emitter terminal frame, a collector terminal frame and a gate terminal frame, which form said main terminal frames and are insert-molded in the resin case, the emitter and collector terminal frames being installed inside the resin case such that relative positions are offset in the vertical direction.

8. A semiconductor device according to claim 7, wherein said main terminal pieces include an emitter main terminal piece and a collector main terminal piece extending vertically from the respective terminal frames and penetrating the top cover to be drawn from the top surface of the resin case, and said gel sealing resin is a silicone gel filling the lower side of the terminal frame and the resin case.

* * * * *

UNITED STATES PATENT AND TRADEMARK OFFICE
CERTIFICATE OF CORRECTION

PATENT NO. : 6,011,302
DATED : January 4, 2000
INVENTOR(S) : Akira Nakahira

It is certified that error appears in the above-identified patent and that said Letters Patent is hereby corrected as shown below:

On the title page, insert item

[30] Foreign Application Priority Data
    May 29, 1997  [JP] Japan .......9-139600

Signed and Sealed this

Twenty-first Day of November, 2000

Attest:

Q. TODD DICKINSON

Attesting Officer    Director of Patents and Trademarks